United States Patent [19]

Handy

[11] 4,240,068
[45] Dec. 16, 1980

[54] CCD ANALOG TO DIGITAL CONVERTER

[75] Inventor: Roland J. Handy, Northridge, Calif.

[73] Assignee: Xerox Corporation, Stamford, Conn.

[21] Appl. No.: 918,251

[22] Filed: Jun. 23, 1978

[51] Int. Cl.³ ............................................. H03K 13/02
[52] U.S. Cl. ......................... 340/347 AD; 340/347 M; 357/24
[58] Field of Search .................. 340/347 M, 347 AD; 357/24; 307/221 C, 221 D

[56] References Cited

U.S. PATENT DOCUMENTS

| | | | |
|---|---|---|---|
| 3,903,543 | 9/1975 | Smith | 357/24 |
| 3,930,255 | 12/1975 | Means | 340/347 AD |
| 3,958,210 | 5/1976 | Levine | 307/304 X |
| 4,058,717 | 11/1977 | Engeler | 357/24 X |
| 4,072,938 | 2/1978 | Buchanan | 340/347 AD |
| 4,087,812 | 5/1978 | Terman | 357/24 X |
| 4,115,766 | 9/1978 | Smith | 357/24 X |
| 4,136,335 | 1/1979 | Tompsett | 340/347 AD |

OTHER PUBLICATIONS

Mok et al., A Charge-Transfer-Device Logic Cell, Solid-State Electronics, 1974, vol. 17, pp. 1147-1154.
Hoeschele, Analog-To-Digital/Digital ∝ To-Analog Conversion Techniques, John Wiley & Sons, Inc., 1968, p. 421.

*Primary Examiner*—Thomas J. Sloyan
*Attorney, Agent, or Firm*—Franklyn C. Weiss

[57] ABSTRACT

An analog to digital converter as implemented by large scale integrated circuit techniques utilizing charge coupled device technology. On a single integrated circuit chip, the necessary gate and charge packet transfer paths are formed to allow for the analog to digital conversion. Depending on the amount of charge transferred from one location to the next the two outputs will denote a digital voltage level indicative of logic 0 or logic 1.

6 Claims, 2 Drawing Figures

CCD ANALOG TO DIGITAL CONVERTER

BACKGROUND OF THE INVENTION

Charge-coupled semiconductor devices were first described in an article of similar title as published in the Bell System Technical Journal, Volume 49, Number 4, 1970, pages 587 to 593. Since that time much research has been conducted on CCD's to the present time wherein 64 kilobit single chip CCD memories have reached the commercial marketplace. (IEEE Spectrum, May 1978, page 36).

Memories are not the only use for CCD's, however. CCD's can be utilized in image sensing arrays and also for analog signal processors (Electronic Design 6, Mar. 15, 1976, page 70). However, the prior art does not show the use of CCD technology in analog to digital signal conversion wherein the actual conversion is accomplished directly on the CCD integrated circuit chip itself. Such a device would reduce the number of CCD and other type integrated circuit chips and increase signal to noise, amplification ratios, etc., due to the fact that the entire analog to digital conversion is done on one device.

SUMMARY OF THE INVENTION

The present invention provides a charge-coupled device technology, single integrated circuit chip whereupon analog to digital signal conversion takes place. Charge is deposited under an input gate A by transfer of a packet of charge from a preceding gate, for example, or by generation of charge packets at a photosite on the chip as in an image system. By use of a floating gate master FGM and a floating gate slave FGS, certain levels of charge detected at the input gate will be detected, which allows the floating gate slave FGS gate to determine which output will be present, as fully described in the body of the present application. The voltage outputs of the circuit are the digital logic levels representative of the input analog signal.

OBJECTS OF THE PRESENT INVENTION

It is, therefore, an object of the present invention to utilize charge-coupled transfer technology for analog to digital signal conversion.

It is another object of the present invention to utilize charge packet transfer on an integrated circuit chip to effect analog to digital signal conversion.

It is a further object of the present invention to provide analog to digital signal conversion by utilizing charge-coupled technology on a single integrated circuit.

DESCRIPTION OF THE DRAWINGS

For a more complete understanding of the invention as well as other objects and further features thereof, reference may be had to the following detailed description of the invention in conjunction with the drawings wherein.

DETAILED DESCRIPTION OF THE INVENTION

Charge coupled devices are inherently analog devices due to the fact that the charge packets associated with each individual charge coupled device on a silicon substrate vary from zero to a predetermined maximum value, depending upon the applied voltage to that particular CCD. Thus, charge coupled devices are ideal for use wherein an input signal is of an analog nature which can be subsequently utilized with subsequent circuitry for modifying, encoding, amplifying, etc., any particular signal output. Further, CCD's lend themselves to large scale integrated circuit techniques for manufacture where the density of the circuits on a substrate chip run into the thousands and which allow CCD's to be valuable in analog situations. In certain instances, an analog signal is desired to be converted to digital signals, and many such techniques are old in the art, as analog to digital conversion is a well known technique and has been for many years. However, analog to digital conversion using charge transfer technology in a charge coupled device is a new concept and the art is sparse in this area. One such reference is entitled "An Analog to Digital Converter Using Charge Transfer Technology" on Page 4 of the 1977 IEEE International Solid State Circuits Conference Proceedings.

However, a charge coupled device which is able to convert a signal from analog to digital form on one integrated circuit chip has not been disclosed in the prior art previous to the present application.

The obvious advantages of utilizing analog to digital conversion on a single chip are many fold. For example, converting an analog signal to a digital signal within the confines of a single charge coupled device integrated circuit chip allows for much higher accuracy in the conversion process because the obvious use of fewer circuits and components decreases the chances for error, noise, etc. Further, analog to digital conversion on a single integrated circuit chip allows for immediate digital operation in essentially an analog environment.

Figure 1:
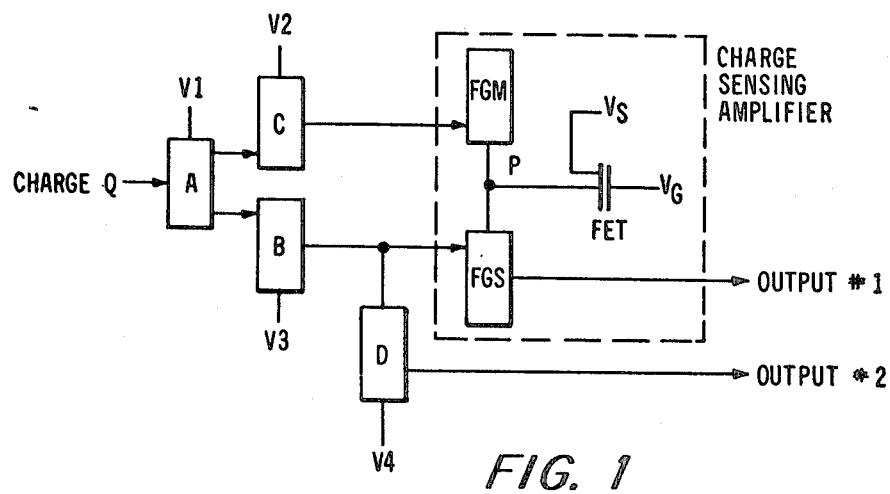
FIG. 1 is a schematic representation of an analog to digital signal converter cell utilizing the charge-coupled transfer technology.
Figure 2:
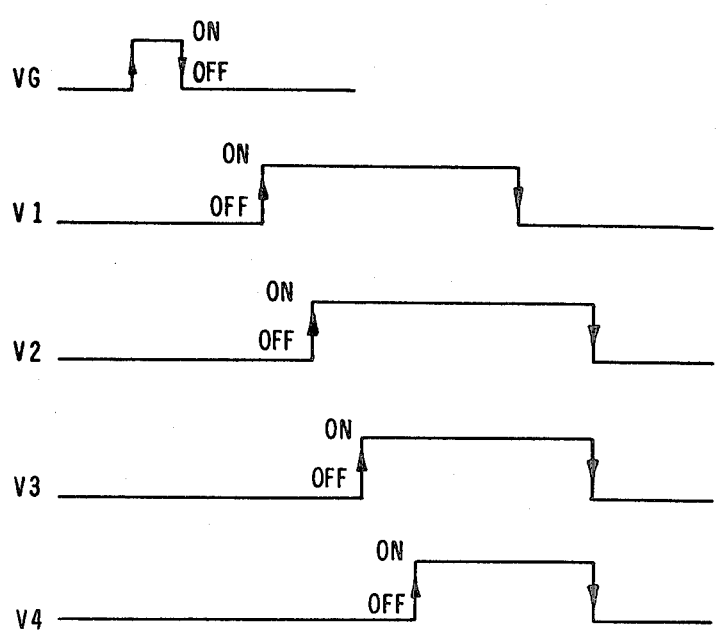
FIG. 2 is a timing diagram of the application of voltage signals to the converter described in conjunction with FIG. 1.

FIG. 1 shows a typical cell embodying the principles of the present invention. Since the individual gates and other components shown in FIG. 1 may be part of a larger integrated circuit, the arrows shown are not strictly electrical connections in the typical sense, but are paths for which either a charge or a voltage is applied or for charge to be moved from one area to another on the integrated circuit chip. Thus, FIG. 1 shows an input gate A and as an input to the gate there is a charge path for which charge may be applied to the gate. Also, connected to input gate A is a voltage V1 which is applied to establish the depth of the depletion layer to establish the amount of charge that can be stored in the input gate. FIG. 2 depicts a timing diagram for the application of the various voltage potentials. From input gate A is shown two arrows which denote paths of movement of charge from this depletion layer to gates B and C. Coupled to the input of gate B is voltage V3 and coupled to gate C is voltage V2 which establishes the depletion layers for these gates, respectively.

Also shown in FIG. 1 is a charge sensing amplifier CSA which comprises a floating gate master FGM and floating gate slave FGS which are coupled together to the field effect transistor FET. Shown coupled to the intersection of the line from the FGM and the FGS is a line coupled to the source of the field effect transistor FET. Coupled to the drain of the FET is voltage VS and coupled to the gate of the FET is voltage VG. Also coupled to the path between gate B and the FGS is gate D which has an input of voltage V4. The output from the FGS is considered Output Number 1 and the output of gate D is considered the Output Number 2. These outputs have on the line a voltage level of a logic zero or a voltage level of a logic one in binary terms. This is a digital output which can be used for a subsequent operation either on the integrated circuit chip itself or directed to an output circuit. However, it is to be understood that an analog charge Q applied to analog gate A generates, in a manner to be hereinafter described, voltage signals on Outputs Number 1 and 2 which are seen to be digital.

The charge input into input gate A for purposes of explaining the operation of the circuit in FIG. 1, is, for ease of description, defined at being at 2Q. This charge can be generated in any of the known manners for use in operating a charge coupled device, such as from another stage in a charge coupled device or from the use of the charge coupled device in an imaging technique wherein light impinges upon a photosite, such as is used when CCD's are used in an imaging environment. If the charge of 2Q is dumped under input gate A when the predetermined voltage V1 is applied to gate A, the depletion layer formed at gate A by the voltage will be quickly filled with the charge in the manner known in the art in the operation of charge coupled devices. As described above, CCD gates C and B are coupled to the output of gate A. Upon application of voltage V2 (See FIG. 2) on gate C, and if the voltage V2 is also carefully predetermined, the excess charge of 1Q occupying the depletion layer in gate A will be quickly transferred to gate C in the normal CCD charge transfer technique. In the charge sensing amplifier, CSA, the voltage VS is applied to the drain terminal of the field effect transistor FET which is part of the integrated circuit on the chip along with the rest of the CCD circuit being described herein. When voltage VG is applied to the field effect transistor FET at the gate terminal, the voltage VS is immediately applied to point P which is shown to be between the floating gate master FGM and the floating gate slave FGS. Once voltage VS is applied to point P, voltage VG is turned off and the voltage VS will remain at point P. Thus, in order to energize initially the FGM and the FGS, voltage VG will be applied prior to applying voltage V1 to input gate A. If voltage VG had been applied initially as just explained, when voltage V2 is applied to gate C, and there is an excess charge of Q in the input gate A, this charge will be transferred through gate C to the FGM. When charge is deposited under the FGM gate, the surface potential under the FGS gate will be changed toward zero volts.

Returning to input gate A, the remaining charge Q is detected at gate B and is transferred, when voltage V3 is applied to gate B to the FGS. Since the FGS surface potential has increased from its initial position, because of charge being deposited under the FGM gate, the charge under gate B, if there is any, will be blocked by the surface potential barrier under the FGS gate. Thus, the output number 1 of the FGS will remain at a logic zero. However, since the charge from gate B has not been transferred through the FGS gate, then when voltage V4 is applied to gate D, gate D will now have the charge transfer from gate B to gate D, and thus at the application of voltage V4 the charge will be transferred through gate D to the output and detected as a logic one. Thus, when a charge of 2Q or maximum charge to fill input gate A is applied to gate A, Output 1 will have a logic zero and Output 2 will have a logic one.

Assume now that only a charge of Q is applied to gate A. Voltage VG had been applied to the FET and thus voltage VS appears at point P between FGM and FGS. Since there is no excess charge greater than Q under gate A after application of voltage V1, upon the application of voltage V2 to gate C, no excess charge is transferred via gate C from gate A to the FGM. Accordingly, there is no change of the surface potential of the FGS from the influence of the FGM. Therefore, when voltage V3 is applied to gate B, the charge Q in gate A will be transferred to gate B. However, as voltage VS appears at point P, FGS is enabled and thus when voltage V3 is applied to gate B, the charge Q on gate A will be transferred via gate B to the FGS which now detects the charge and the Output Number 1 may be considered, therefore, to be a logic one. When it comes time for voltage V4 to be applied to gate D, no charge remains on input gate A to be transferred via gate B and thus Output 2 is considered a logic zero. Thus, when only a charge of Q appears at input gate A, Output 1 is a logic one and output 2 is a logic zero.

When the input charge to gate A is zero, no charge can be transferred to either FGM or gate D and thus the output at Outputs 1 and 2 are both logic zero. Accordingly, it is apparent then that depending upon the charge level applied to the input gate A, the output from Outputs 1 and 2 will be the logic levels as set forth above. Further, a charge applied to gate A less than Q will render Output 1 at logic one and Output 2 at logic zero. Thus, the cell described in FIG. 1 will operate as a true analog to digital converter. For ease of description, the input charge was defined as 2Q. The charge, in actuality, can be any defined level, the circuit will divide the charge in half.

While the invention has been described with reference to specific embodiments, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. An analog to digital converter utilizing charge coupled technology comprising:
    input gate means for receiving the applied analog packet of charge,
    second gate means in charge transfer proximity to said input gate means for receiving charge therefrom in excess of a predetermined level,
    third gate means also in charge transfer proximity to said input gate means for receiving charge therefrom below a predetermined level,
    fourth gate means in charge transfer proximity to said second gate means for receiving any said excess charge received from said input gate means,
    fifth gate means in charge transfer proximity to said third and fourtth gate means and directly responsive to the presence of said excess charge in said fourth gate means to thereby inhibit the transfer of any charge in said third gate means when said fourth gate means detects any of said excess charge transferred by said second gate means, and sixth gate means in charge transfer proximity to said third gate means for receiving and transferring any said charge below said predetermined level received from said input gate means subsequent to when said fifth gate means was inhibited due to the presence of said excess charge in said fourth gate means and thus blocked the receipt and transfer of charge from said third gate means, the output from said fifth and sixth gate means being one of three pairs of digital logic voltage signals representing the presence of charge received, an excess of charge received, or no charge received, respectively, at said input gate means.

2. The analog to digital converter as set forth in claim 1 further including:

phased voltage source means coupled to said first, second, third, and sixth gate means to activate each of said gate means in a predetermined sequence by setting the depth of the depletion layers to allow the receipt and transfer of said packets of charge.

3. An analog to digital signal converter on a single integrated circuit chip utilizing charge transfer technology comprising:

input gate means for receiving an input analog signal represented by packets of charge, transfer gate means coupled to said input gate means for transferring any such packets of charge, said transfer gate means comprising first and second transfer gates in charge packet transfer relationship with said input gate means, said first transfer gate transferring an excess of a predetermined charge, and said second transfer gate transferring a charge at or below said predetermined charge, the charge levels being determined by the depletion levels established by applied voltage levels, and output gate means including charge sensing amplifier gate means coupled to said transfer gate means for detecting the presence of charge transferred, an excess of charge transferred, or no charge transferred, the output of said output gate means being a pair of digital logic voltage signals indicative of these three conditions, said charge sensing amplifier gate means comprising a master gate and a slave gate in charge packet transfer relationship with said first and second transfer gates, said master and slave gates having an externally applied voltage potential thereto which is independent from other applied voltages, said master gate inducing a change in the potential in said slave gate whereby said slave gate blocks the transfer of charge from said second transfer gate when said master gate detects an excess charge transferred by said first transfer gate.

4. The analog to digital converter as set forth in claim 3 wherein said output gate means further comprises a third transfer gate in charge packet transfer relationship with said second transfer gate, said third transfer gate transferring any charge remaining in said second transfer gate that may have been blocked by said slave gate, the charge level on said third transfer gate being determined by the depletion level established by an applied voltage level.

5. The analog to digital converter as set forth in claim 4 wherein said externally applied voltage potential is applied to said master and slave gates via a voltage switched field-effect transistor.

6. The analog to digital converter as set forth in claim 5 wherein the charge transferred by the slave gate comprises one output digital signal and the charge transferred by said third transfer gate comprises a second output digital signal, said digital signals being representative of logic 00, 01, 10 levels.

* * * * *